United States Patent [19]

Mochida et al.

[11] Patent Number: 5,219,112
[45] Date of Patent: Jun. 15, 1993

[54] WIRE BONDING APPARATUS

[75] Inventors: Tooru Mochida; Yoshimitsu Terakado; Akihiro Hirayanagi, all of Tokyo, Japan

[73] Assignee: Kabushiki Kaisha Shinkawa, Tokyo, Japan

[21] Appl. No.: 879,323

[22] Filed: May 7, 1992

[30] Foreign Application Priority Data

May 7, 1991 [JP] Japan ................... 3-130215

[51] Int. Cl.$^5$ .......................... H01L 21/603
[52] U.S. Cl. .......................... 228/4.5; 228/8
[58] Field of Search ............. 228/102, 110, 179, 4.5, 228/8, 56.5

[56] References Cited

U.S. PATENT DOCUMENTS

| | | | |
|---|---|---|---|
| 4,438,880 | 3/1984 | Smith et al. | 228/1.1 |
| 4,984,730 | 1/1991 | Göbel et al. | 228/1.1 |
| 5,060,841 | 10/1991 | Oshima et al. | 228/4.5 |

FOREIGN PATENT DOCUMENTS

| | | | |
|---|---|---|---|
| 103148 | 6/1983 | Japan | 228/4.5 |
| 184734 | 10/1983 | Japan | 228/4.5 |
| 290730 | 12/1986 | Japan | 228/4.5 |
| 21234 | 1/1987 | Japan | 228/4.5 |
| 64-9730 | 2/1989 | Japan . | |
| 1-31695 | 6/1989 | Japan . | |
| 143541 | 6/1990 | Japan | 228/4.5 |

Primary Examiner—Samuel M. Heinrich
Attorney, Agent, or Firm—Koda & Androlia

[57] ABSTRACT

In a bonding apparatus for semiconductor devices, etc., a linear sensor is mounted on a bonding head frame. An arm holder which has a bonding capillary at one end is pivotally mounted to the bonding head frame, and the linear sensor is positioned so that it faces a middle portion of the arm holder which locates an opposite side of pivotal point of the arm holder from the capillary. The linear sensor detects the gap between the arm holder and the bonding head frame when the arm holder pivots, thus determining the bonding surface level of a workpiece by the capillary which comes into contact with the workpiece.

3 Claims, 3 Drawing Sheets

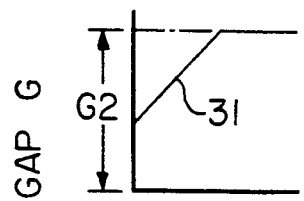
FIG. 4
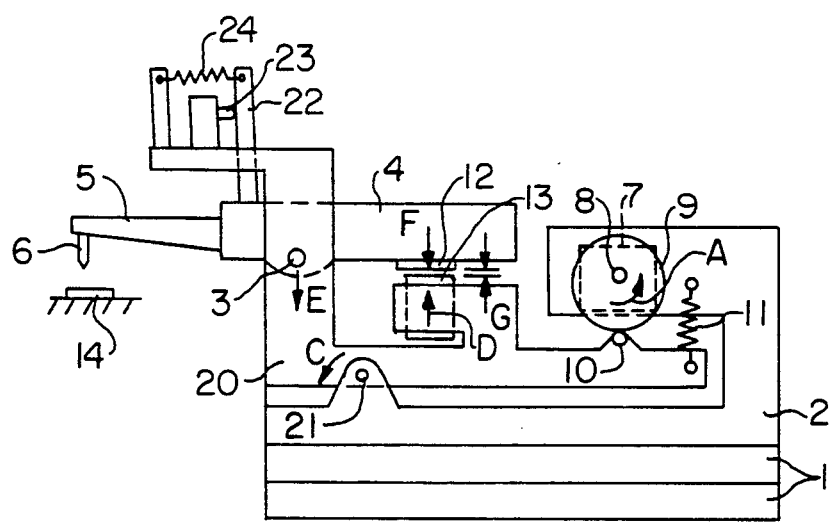
FIG. 5
FIG. 6

WIRE BONDING APPARATUS

BACKGROUND OF THE INVENTION

1. Field of the Invention

The present invention relates to a wire bonding apparatus and more particularly to a wire bonding apparatus equipped with a bonding surface level detecting means.

2. Prior Art

Conventional examples of wire bonding apparatuses which detect the level or height of the bonding surface are disclosed in Japanese Patent Application Publication ("Kokoku") No. 64-9730 and Japanese Patent Application Laid-Open ("Kokai") No. 1-31695.

In these prior art apparatuses, a tool arm that has a capillary, through which a bonding wire passes, is attached to an arm holder, and this arm holder is provided on a lifter arm in such a manner that the arm holder is pivotable. The lifter arm is mounted to a bonding head frame so that the lifter arm can move up and down or can pivot. In addition, a gap detection sensor is attached to the lifter arm. The detection sensor is installed so as to face the tool arm.

When the lifter arm is lowered, or when the lifter arm is pivoted so that the lifter arm on the capillary side is lowered, the capillary descends and is brought into contact with the bonding surface. Then, the lifter arm is further lowered or pivoted from this point, so that the gap between the tool arm and a gap detection sensor changes, and the time at which the gap distance is changed for a given amount from the initial position is taken as the time of contact of the capillary with the bonding surface.

As described above, in the prior art devices, the gap detection sensor is provided on the lifter arm, which is raised and lowered or caused to pivot, and such a gap detection sensor is installed so as to face a part of the tool arm. In other words, the sensor faces a part of the tool arm which is on the same side where the capillary is held by the tool arm. As a result, the following problems arise:

Since the sensor is on the lifter arm which is raised and lowered or caused to pivot and therefore is extremely susceptible to vibration, erroneous detections easily occur due to micro-vibrations of the lifter arm.

In addition, after the capillary has contacted the bonding surface, the gap detection sensor is lowered together with the lifter arm. At the same time, the tool arm also rotates about the bonding surface. In this case, the tool arm is moved in the direction away from the gap detection sensor; as a result, the change in the gap between the gap detection sensor and the tool arm becomes small. This causes a response delay and the inaccurate detection of the bonding surface level.

Furthermore, since the gap detection sensor in the prior art is a magnetic sensor, there is a response lag with respect to the threshold value of the sensor. This means that there is a time pass between the time when an actual contact of the capillary with the bonding surface is made and the time when the detection of the bonding surface is made by the magnetic sensor. As a result, the "sink-in" caused by the capillary that presses the wire against the bonding surface increases for the time period that corresponds to the "sink-in."

SUMMARY OF THE INVENTION

Accordingly, it is a primary object of the present invention to provide a wire bonding apparatus which detects the level of a bonding surface with high precision.

It is another object of the present invention to provide a bonding surface detecting means by way of gap detection in a wire bonding apparatus.

The objects of the present invention are accomplished by a unique structure for a wire bonding apparatus in which an arm holder that has a capillary at its tip end is mounted to a bonding head frame via a pivot axle so that the arm holder is pivotable about the pivot axle, and in this structure a gap detection sensor, which detects the gap between the arm holder and the bonding head frame, is attached to the bonding head frame so that the sensor faces a portion of the arm holder which is an opposite from the portion where the capillary is with a pivotal point in between.

The object of the present invention is also accomplished by basically the same structure as the one described above for a wire bonding apparatus in which an arm holder that has a capillary at its tip end is pivotally mounted to a lifter arm which is further pivotally mounted to the bonding head frame, and in this structure, a gap detection sensor, which detects the gap between the arm holder and the bonding head frame, is attached to the lifter arm so that the sensor faces a portion of the arm holder which is opposite from the portion where the capillary is with a pivotal point in between.

In these structures, a linear sensor is used as the gap detection sensor.

In the first structure described above, since the gap detection sensor is provided on the bonding head frame, the gap distance between the detection sensor and the arm holder changes in proportion to the amount by which the arm holder makes its pivot motion.

Accordingly, when the capillary moves downward for performing a bonding, the gap between the arm holder and the bonding head frame changes greatly in proportion to the amount which the capillary is lowered. Then, when the capillary has come into contact with the bonding surface, the amount of movement of the arm holder abruptly decreases; in other words, the changes in the gap becomes extremely small or none so that the gap becomes more or less invariable. As a result of this abrupt decrease in the gap change, the level of the bonding surface is detected.

Thus, since the bonding surface is detected at the point of time where the change in the gap becomes abruptly smaller, the level of the bonding surface is detected very precisely. Also, since the gap detection sensor is attached to the bonding head frame and not on the arm holder, the sensor is less affected by vibrations, thus decreasing the chances of detection errors of the gap.

In the second structure described above, when the capillary is moved downwardly in its pivot motion, the gap between the gap detection sensor and the arm holder remains unchanged until the capillary comes into contact with the bonding surface. Once the capillary contacts the bonding surface, the gap detection sensor on the lifter arm moves together with the lifter arm, and the arm holder makes a pivot movement about the capillary. In this case, the arm holder which faces the gap detection sensor moves in the direction opposite to the moving direction of the gap detection sensor. Accordingly, the change in the gap distance is increased, in other words, the gap changes for an amount that corresponds to the amount of pivot of the arm holder plus the amount of movement of the gap detection sensor. In other words, since the rate of change in the gap becomes great after the capillary has contacted the bonding surface, the response speed of the gap detection sensor is high.

In addition, since the linear sensors are used as the gap detection sensors, successive detections of the gap are performed, and since there is no response lag, the precision of detection is further improved.

BRIEF DESCRIPTION OF THE DRAWINGS

FIG. 4 is an enlarged illustration of the gap between the detection plate and the linear sensor used in the device of FIG. 3;

FIG. 5 is a side view of a still another bonding level detecting means used in the bonding apparatus according to the present invention;

FIG. 6 is an enlarged illustration of the gap between the detection plate and the linear sensor used in the device of FIG. 5;

DETAILED DESCRIPTION OF THE INVENTION

Figure 1:
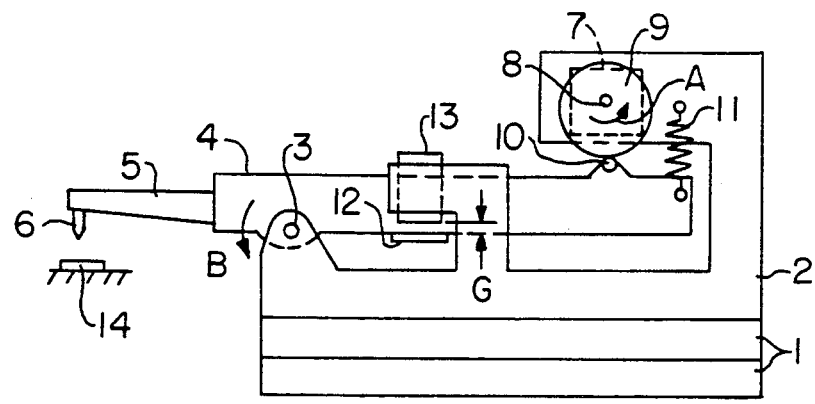
FIG. 1 is a side view of a bonding level detecting means used in the bonding apparatus according to the present invention.

One embodiment of the present invention will be described below with reference to FIG. 1 first.

A bonding head frame 2 is mounted on an XY table 1. A supporting axle or pivot axle 3 is installed on the bonding head frame 2 so that the pivot axle 3 is rotatable. To this pivot axle 3, an arm holder 4 is mounted, and a tool arm 5 is attached to the forward end of the arm holder 4. A capillary 6 is attached to the tip end of the tool arm 5.

A motor 7 which makes forward and reverse rotations is mounted on one end of the bonding head frame 2. A cam shaft 8 is coupled to the output axle of the motor 7, and a cam 9 is attached to the cam shaft 8.

The tail end of the arm holder 4 is biased or urged by a spring 11 so that a cam follower 10, which is a roller rotatably installed on the arm holder 4, is pressed against the cam 9.

A detection plate 12 is attached to the undersurface of the arm holder 4. The detection plate 12 is located on the opposite side of the pivot axle 3 from the capillary 6. In other words, the detection plate 12 is provided on a middle portion of the arm holder 4 which is located between the pivot axle 3 and the tail end of the arm holder 4. The detection plate 12 projects from the side surface of the arm holder 4.

Reference numeral 13 is a linear sensor or a gap detecting sensor. The linear sensor 13 is mounted to the bonding head frame 2 so that the linear sensor 13 faces the upper surface of the detection plate 12 so that it detects the gap distance between the sensor itself, which is on the bonding head frame, and the detection plate 12, which is on the arm holder 4.

The cam 9 is a linear or eccentric cam and has a dropping profile for a 180-degree range of forward rotation when rotated in the direction of arrow A from the state shown in FIG. 1. In other words, the cam 9 rotates in the forward and reverse directions for a range of 180 degrees and provides a dropping profile when it rotates in the forward direction and a rising profile when it rotates in the reverse direction.

Figure 2:
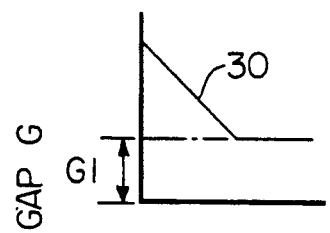
FIG. 2 is an enlarged illustration of the gap between the detection plate and the linear sensor used in the device of FIG. 1.

In the structure described above, when the cam 9 is rotated in the forward direction (i.e., in the direction indicated by arrow A), the dropping profile of the cam 9 causes the forward end of the arm holder 4 to pivot about the pivot axle 3 in the direction shown by arrow B, and the capillary 6 is lowered. When the capillary 6 is thus moved down, the gap G between the detection plate 12 and the linear sensor 13 changes greatly in accordance with the amount of pivot motion of the arm holder 4. This great deal of gap change is shown by reference numeral 30 in FIG. 2. As a result, a voltage or current which is proportional to the gap G is outputted by the linear sensor 13.

Once the capillary 6 has come into contact with the workpiece 14, the gap G does not change further. In other words, the gap G becomes consistent as referred to as G1 in FIG. 2, and no further gap change occurs. As a result, a constant voltage or current is outputted by the linear sensor 13.

When such a constant current or voltage is outputted by the linear sensor 13, the level of the bonding surface is ascertained by a control circuit (shown in FIG. 8 and will be described below) on the basis of the constant output, and the thus obtained detection point data is stored in the memory of the control circuit.

Using this detection point as a standard, the motor 7 is rotated a predetermined amount, so that the "sinking in" of the capillary is accomplished. Then, the wire (not shown) which passes through the capillary 6 is bonded to the workpiece 14, the motor 7 is rotated in the reverse direction, and the capillary 6 is raised by the rising profile of the cam 9.

As described above, the gap G is continuously read by the linear sensor 13 from a point where the gap G changes greatly to a point where the gap G ceases its change, i.e., to the point where the gap G becomes invariable, and then the level or the height of the bonding surface is detected accordingly. Therefore, the detection response is good, and the precision with which the bonding surface level is detected is improved.

In addition, since the linear sensor 13 is attached to the bonding head frame 2 which does not move either upward or downward, vibrations affect the sensor 13 less as compared to the conventional apparatuses in which the sensor is attached to a part which moves up and down.

Figure 3:
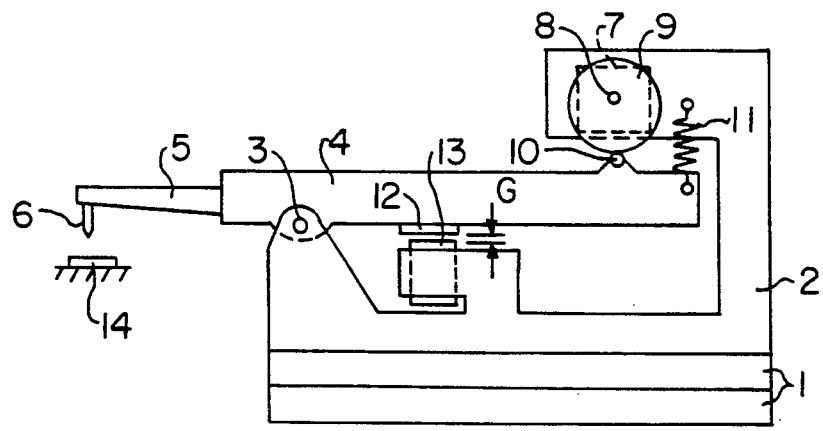
FIG. 3 is a side view of another bonding level detecting means used in the bonding apparatus according to the present invention.

FIG. 3 illustrates a modification of the embodiment described above.

In this modified embodiment, the linear sensor 13 or the gap detecting sensor is mounted to the bonding head frame 2 so that the sensor 13 faces the undersurface of the detection plate 12. Thus, in this embodiment, the gap G changes a great deal, as indicated by numeral 31 in FIG. 4, when the capillary 6 is lowered, and once the capillary 6 has come into contact with the workpiece 14, the gap G becomes invariable as referred to as gap G2 in FIG. 4. The same effect as that obtained in the embodiment of FIG. 1 is obtainable by using the gap detecting structure shown in FIG. 3.

FIG. 5 illustrates still another embodiment of the present invention. In this embodiment, the arm holder is indirectly mounted to the bonding head frame; in other words, the arm holder is mounted to a lifter arm which is mounted to the bonding head frame. In the following description, elements which are the same as or correspond to those in FIG. 1 will be labeled with the same reference numerals.

In FIG. 5, the pivot axle 3 attached to the arm holder 4 is rotatably mounted on a lifter arm 20, and another pivot axle 21 is provided on the lifter arm 20, and this pivot axle 21 is rotatably installed on the bonding head frame 2.

Stoppers 22 and 23 are provided on the arm holder 4 and lifter arm 20, respectively. These stoppers are positioned so that they face each other and the arm holder 4 can pivot together with the lifter arm 20. A spring 24 is provided between the arm holder 4 and the lifter arm 20 so that the stoppers 22 and 23 are caused to contact each other.

The linear sensor 13 is attached to the lifter ar 20 so that the sensor 13 faces the undersurface of the detection plate 12 that is attached to the middle portion of the arm holder 4.

With this structure, when the cam 9 is rotated in the forward direction (i.e., in the direction indicated by arrow A), the dropping profile of the cam 9 causes the lifter arm 20 to pivot about the pivot axle 21 in the direction of arrow C. As a result, the pivot axle 3 is lowered. Since the arm holder 4 is caused to come into contact with the lifter arm 20 by the force of the spring 24, the arm holder 4 along with the capillary 6 are lowered when the pivot axle 3 is lowered. In this state the gap G between the detection plate 12 and the linear sensor 13 is as shown by an invariable gap G3 in FIG. 6.

Once the capillary 6 contacts the workpiece 14, the capillary 6 stops its descending movement. However, since the lifter arm 20 continues to pivot in the direction of arrow C about the pivot axle 21, the linear sensor 13 moves toward the detection plate 12 as shown by arrow D. Also, since the pivot axle 3 is lowered in the direction of arrow E, the detection plate 12 is lowered as shown by arrow F. The amount the detection plate 12 is lowered is equal to the amount the pivot axle 3 is lowered plus an amount that corresponds to the ratio of (a) the distance between the capillary 6 and the pivot axle 3 and (b) the distance between the capillary 6 and the detection plate 12.

In other words, since the linear sensor 13 moves upward and the detection plate 12 moves downward as described above, the gap G decreases by an amount corresponding to the sum of the above two amounts of movements. As a result, the gap G changes a great deal as shown by reference numeral 32 in FIG. 6, and a voltage or current which is proportional to this change in the gap G is outputted by the linear sensor 13. When such an altered voltage or current is outputted by the linear sensor 13, the level of the bonding surface is ascertained by a control circuit (described below) on the basis of this output, and the detection point data is stored in the memory of the control circuit. Using this detection point as a standard, the motor 7 is rotated by a fixed amount, so that the "sinking in" of the capillary 6 is accomplished.

Then, the wire (not shown) which passes through the capillary 6 is bonded to the workpiece 14, the motor 7 is rotated in the reverse direction, and the capillary 6 is raised by the rising profile of the cam 9.

As seen from the above, after the capillary 6 has contacted the workpiece 14, the detection plate 12 moves in the direction opposite to the direction of the movement of the linear sensor 13. Accordingly, the gap G changes by an amount that corresponds to the sum of these amounts of movements, and the change in the gap G is great, so that the response is improved.

Figure 7:
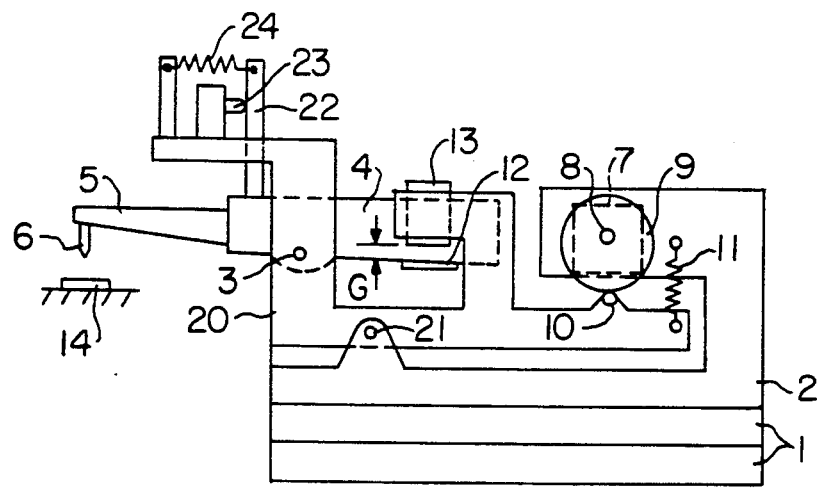
FIG. 7 is a side view of yet another bonding level detecting device means in the bonding apparatus according to the present invention.

FIG. 7 illustrates a modification of the embodiment described in FIG. 5.

In this modified embodiment of FIG. 7, the detection plate 12 projects from the side of the arm holder 4, and the linear sensor 13 is attached to the lifter ar 20 at the position where the sensor faces the upper surface of the detection plate 12.

Figure 8:
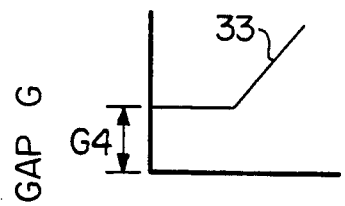
FIG. 8 is an enlarged illustration of the gap between the detection plate and the linear sensor used in the device of FIG. 7.

Accordingly, in this embodiment, the distance of the gap G4 is kept constant as shown in FIG. 8 when the capillary 6 is lowered. Then, when the capillary 6 contacts the workpiece 14, the gap G increases as shown by reference numeral 33 in FIG. 8. The same effect as that obtained in the embodiments in FIGS. 1 through 6 can be obtained when the structure of FIG. 7 is used.

In all of the embodiments described above, the arm holder 4 is mounted to the bonding head frame 2 or to the lifter arm 20 via the pivot axle 3 so that the arm holder 4 can pivot. It is also possible to mount the arm holder 4 to the bonding head frame 2 or the lifter arm 20 via a plate-spring in a pivotable manner. In addition, the lifter arm 20 can be mounted to the bonding head frame 2 via a plate-spring too.

In addition, the gap detection sensor is not limited to the linear sensor 13. However, as long as a linear sensor is used, a precise detection can be accomplished because there is no response lag as there is in magnetic sensors.

Figure 9:
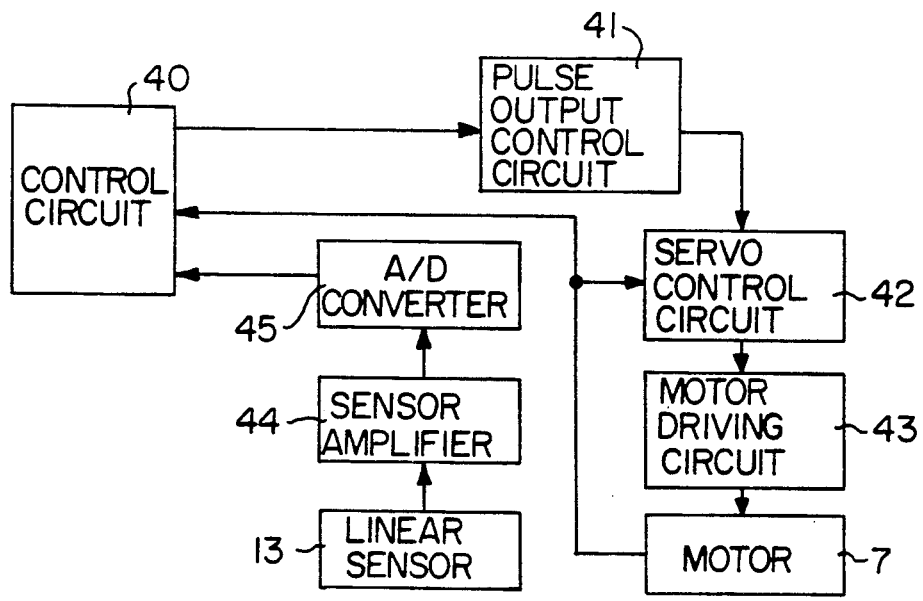
FIG. 9 is a block diagram of the control device used for the bonding apparatus of the present invention.

FIG. 9 shows one type of controller circuit used in the present invention.

In this Figure, the motor 7 is driven via a pulse output control circuit 41, servo control circuit 42 and motor driving circuit 43 in accordance with the data stored beforehand in a control circuit 40. The amount of forward rotation and amount of reverse rotation of the motor 7 are read into the control circuit 40 and servo control circuit 42.

The output of the linear sensor 13 based on gaps G between the detection plate 12 and linear sensor 13 that are measured when the capillary 6 is being lowered via the motor 7 is continuously amplified by a sensor amplifier 44, and the output of the amplifier 44 is converted into digital data by an A/D converter 45 and then inputted into the control circuit 40.

The control circuit 40 ascertains the point of time where the distance change of the gap G becomes invariable after a great change in the gap distance, or the point of time where the gap G begins to change greatly after continuously not changing. This detection point is stored in the memory of the control circuit 40 as a level of bonding surface. Subsequently, the "sinking in" of the capillary 6 and the amount the capillary 6 is raised after bonding, etc., are determined by controlling the amount of rotation of the motor 7 by the use of detection points of the level of the bonding surface as a standard.

As described above in detail, according to the present invention, in a wire bonding apparatus in which an arm holder that holds a capillary is pivotally mounted to a bonding head frame, a gap detection sensor is attached to the bonding head frame so that the gap detection sensor faces a portion of the arm holder that locates the opposite side of the fulcrum of the arm holder from the capillary. Accordingly, bonding surfaces are detected when the change in the gap between the arm holder and the bonding head frame becomes smaller after a great change of the gap. As a result, the level of the bonding surface is detected with high precision without being affected by vibrations. Erroneous detection is thus avoidable.

Furthermore, according to the present invention, the arm holder which has a capillary at one end is pivotally mounted to the bonding head frame via a lifter arm, and a gap detection sensor is attached to the lifter arm so that the gap detection sensor faces a portion of the arm holder that locates the opposite side of the fulcrum of the arm holder from the capillary. Accordingly, the change in the gap between the arm holder and the lifter arm that occurs after the capillary contacts the bonding surface is great, and a good response efficiency of the gap detection sensor is obtainable.

In addition, since a linear sensor is used as the gap detection sensor, any positions of the capillary can be detected. Also, since there is no response lag of the sensor, a precise detection of the gap is obtainable.

We claim:

1. A bonding surface detecting means for a wire bonding apparatus comprising:
    a bonding head frame provided with a cam plate;
    an arm holder provided with a capillary at one end, said arm holder being pivotally mounted to said bonding head frame with its another end urged toward said cam plate by a spring means; and
    a gap detection sensor installed on said bonding head frame for detecting a distance between said arm holder and said gap detection sensor, said gap detection sensor being positioned so as to face a portion of said arm holder which is on an opposite side from a portion where said capillary is located on said arm holder with a pivotal point in between, said gap detection sensor being positioned such that when said holder is pivoted toward a wire bonding point, said capillary contacts said bonding point before said gap detection sensor contacts said arm holder, whereby when said capillary contacts said bonding point, an output signal of said gap sensor becomes constant and a height of the bonding surface is detected.

2. A wire bonding apparatus according to claim 1, wherein said gap detection sensor is a linear sensor.

3. A bonding surface detecting means for a wire bonding apparatus according to claim 1, wherein said arm holder is pivotally mounted on said bonding head frame via a lifter arm which is pivotally provided on said bonding head frame, and said gap detecting sensor is provided on said lifter arm.

* * * * *